United States Patent [19]

Terui

[11] Patent Number: 4,888,633
[45] Date of Patent: Dec. 19, 1989

[54] CHARGE TRANSFER DEVICE HAVING A BURIED TRANSFER CHANNEL WITH HIGHER AND LOWER CONCENTRATIONS

[75] Inventor: Yasuaki Terui, Osaka, Japan

[73] Assignee: Matsushita Electric Industrial Company, Ltd., Japan

[21] Appl. No.: 274,293

[22] Filed: Jun. 16, 1981

[30] Foreign Application Priority Data

Jun. 17, 1980 [JP] Japan .................................. 55-82631

[51] Int. Cl.$^4$ ...................... H01L 29/78; G11C 18/28
[52] U.S. Cl. .......................................... 357/24; 377/58
[58] Field of Search .................................... 357/24 M

[56] References Cited

U.S. PATENT DOCUMENTS

| | | | |
|---|---|---|---|
| 3,852,799 | 12/1974 | Walden | 357/24 M |
| 4,012,759 | 3/1977 | Esser | 357/24 M |
| 4,110,777 | 8/1978 | Esser et al. | 357/24 M |

Primary Examiner—Gene M. Munson
Attorney, Agent, or Firm—Lowe, Price, Leblanc, Becker & Shur

[57] ABSTRACT

A charge transfer device comprising a semiconductor body including a first conductivity type region and a second conductivity region which defines a charge transfer channel below a major surface of the semiconductor body. An insulative layer is provided on the major surface. A plurality of electrodes is attached to the insulative layer to produce potential wells in response to application of different potentials thereto with respect to a common electrode attached to the opposite surface of the semiconductor body. The n-type conductivity charge transfer channel includes a center section of lower impurity concentration and a peripheral section of higher impurity concentration which substantially eliminates the undesirable lateral field effect which would otherwise occur in an area adjacent to the boundary with the first conductivity region.

9 Claims, 2 Drawing Sheets

CHARGE TRANSFER DEVICE HAVING A BURIED TRANSFER CHANNEL WITH HIGHER AND LOWER CONCENTRATIONS

BACKGROUND OF THE INVENTION

The present invention relates to charge transfer devices, and in particular to a charge transfer device of the type in which the charge transfer channel is buried in a semiconductor body of a conductivity type opposite to the conductivity type of the transfer channel.

Many efforts have recently been directed to development of charge transfer devices of the buried channel type in which potential "wells" are produced in response to application of different potentials to electrodes mounted over the channel. Such devices are typically intended for use as delay elements for video information transfer or as a solid state image sensor instead of surface charge transfer type devices. In particular, the use of the channel type devices as a buried image sensor is advantageous because it allows a self-scanning circuitry to be formed on a common semiconductor substrate with charge tranfer channels. However, when applying the charge transfer device as a solid image sensor, the number of potential wells per unit area determines the image quality. An effort for providing as many potential wells as possible in a given space of a semiconductor body has encountered limitations on the maximum quantity of electrons available for transfer to adjacent potential wells because of the undesirable lateral field effect of the potential which occurs in the neighborhood of a boundary with the semiconductor body. The charge transfer channel could have an increased impurity concentration to provide a deeper potential well to accommodate a greater number of electrons therein. However, a higher driving voltage is required to transfer all the electrons from one potential well to the next. Thus, the prior art charge transfer device of the buried channel type is poor in signal-to-noise performance and thus unsatisfactory for solid-stage image sensors.

SUMMARY OF THE INVENTION

Accordingly, an object of the invention is to provide an improved charge transfer device of the buried channel type which eliminates the undesirable lateral field effect to increase the maximum quantity of transferable electrons.

Another object of the invention is to provide a charge transfer device having a semiconductor body and a charge transfer channel of an opposite conductivity type to the conductivity type of the semiconductor body buried therein, the transfer channel having a center region of lower impurity concentration and a peripheral region of higher impurity concentration region to eliminate the lateral field effect.

A further object of the invention is to provide a charge transfer device which is particularly suitable for high density image sensors.

According to the invention, the charge transfer device comprises a semiconductor body having a p-type conductivity region and a charge transfer channel of n-type conductivity formed below the major surface of the semiconductor body by the diffusion of impurity atoms to a desired depth using ion injection or other suitable well known techniques. An insulative layer is provided on the major surface of the semiconductor body. Electrodes are successively arranged on the insulative layer to produce potential wells in response to application of different potentials to adjacent electrodes with respect to a common electrode attached to the opposite surface of the semiconductor body. The n-type charge transfer channel is so diffused that a peripheral or side region of the channel has a higher impurity concentration than the impurity concentration of the center region. Preferably, the center region is flanked on opposite sides by the higher impurity concentration regions. Most preferably, the higher impurity region is additionally formed below the center region so that the latter is completely isolated from the p-type conductivity region.

BRIEF DESCRIPTION OF THE DRAWINGS

The features and advantages of the invention will become apparent from the following detailed description which proceeds with reference to the accompanying drawings, in which.

DETAILED DESCRIPTION

Figure 1:
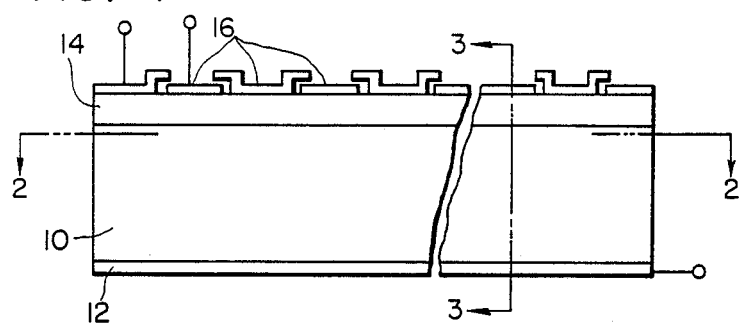
FIG. 1 is an illustration of a side elevational view of a preferred embodiment of the invention.
Figure 2:
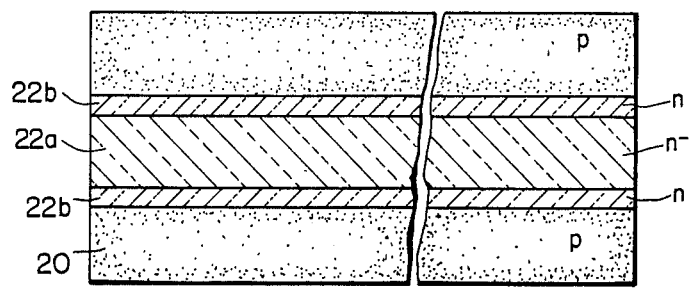
FIG. 2 is an illustration of a cross-sectional plan view taken along the lines 2—2 of FIG. 1.
Figure 3:
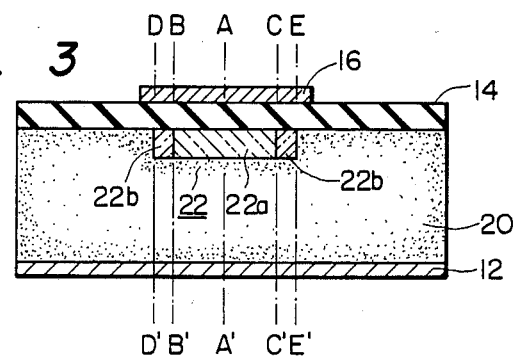
FIG. 3 is an illustration of a cross-sectional view elevational taken along the lines 3—3 of FIG. 1.

In FIGS. 1 to 3, a charge transfer device according to the present invention is shown as comprising a semiconductor body 10 having a p-type conductivity region 20 with an impurity concentration of typically $2.6 \times 10^{15}$ atoms/cm$^3$. Below the major surface of the semiconductor body 10 is formed an n-type conductivity region, or charge transfer channel shown in FIG. 3 and generally designated at 22. On the major surface of the semiconductor body 10 is an insulative layer 14 formed of a material such as $SiO_2$ or $Si_3N_4$. The layer 14 may also be a lamination of $SiO_2$ and $Si_3N_4$. A plurality of electrodes 16 is successively provided on the insulative layer 14 over the transfer channel 22 to produce electric fields therein by application of different potentials to adjacent ones of electrodes 16 with respect to a common electrode 12, thereby storing electrons corresponding in amount to the potential difference between the electrodes. By changing the applied potentials the charge or electrons stored in a given potential well is transferred to an adjacent well of a higher potential.

According to the invention, the n-type conductivity charge transfer channel 22 is formed by ion injection, for example, to a depth of typically 1 micrometer below the major surface of the semiconductor body 10. The charge transfer channel 22 extends in the longitudinal direction of the semiconductor body, as seen in FIGS. 2 and 3, and includes a center longitudinal region 22a of lower impurity concentration and a peripheral longitudinal region 22b of higher impurity concentration on each side of the center region 22a. A typical value of the width of each peripheral region 22b is 1 to 2 micrometers and the center region 22b has a width of typically 10 micrometers or less. The impurity concentration of the center region 22a is typically $7 \times 10^{16}$ atoms/cm$^3$ and the impurity concentration of the peripheral regions 22b is preferably 1.5 to 3 times higher than that of the center region 22a. Therefore, the peripheral regions 22b have an impurity concentration in a range from $1 \times 10^{17}$ atoms/cm$^3$ to $2 \times 10^{17}$ atoms/cm$^3$.

By the formation of the higher concentration regions 22b, the undesired lateral field effect which would otherwise occur in a region close to the boundaries with the p-type semiconductor region 20, is substantially eliminated, so that a higher potential is established in the peripheral area to thereby allow electrons to fill in that area which has not been occupied with electrons with the prior art charge transfer device.

Figure 4:
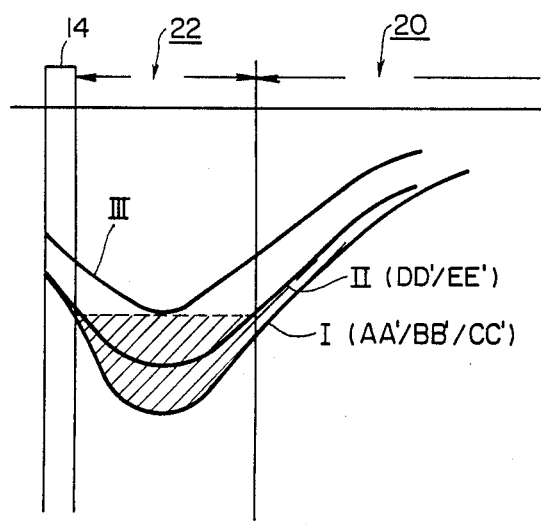
FIG. 4 is a graphic illustration of potential distributions according to the invention.
Figure 5:
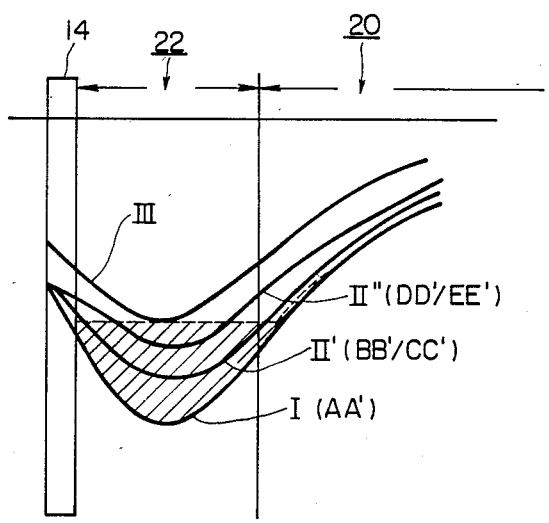
FIG. 5 is a graphic illustration of a prior art charge transfer device for purposes of comparison with the present invention.

FIG. 4 is an illustration of potential distributions of the charge transfer device of the invention across various cross-sections thereof from the insulative layer 14 partially into the p-type conductivity region 20. Curve I indicates the distributions which occur in the cross-sections A,A', B,B' and C,C'. It will be noted that side regions designated B,B' and C,C' have equal potentials to the center region designated A,A'. Curve II indicates the distributions of the peripheral regions adjacent to the boundaries designated D,D' and E,E' which is slightly affected by the lateral field effect. Curve III indicates the distribution of the potential developed in an adjacent potential well. The hatched area represents the amount of electrons to be tranferred to the adjacent potential well. For purposes of comparison the potential distributions of the prior art charge transfer device are indicated in FIG. 5 by the same designations as used in FIG. 4. The maximum number of electrons which can be effectively transferred to adjacent potential wells according to the invention is approximately 1.5 to 2 times greater than that attained by the prior art charge transfer device.

Figure 6:
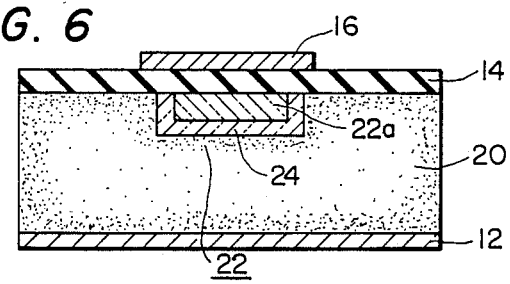
FIG. 6 is an illustration of a modified embodiment of the invention.

The maximum number of electrons which can be transferred from one well to the next can be further increased by providing a higher impurity concentration region below the center lower impurity concentration region 22a so that the latter is completely isolated from the p-type conductivity region 20 by a single layer 24 of higher impurity concentration as illustrated in FIG. 6.

What is claimed is:

1. A charge transfer device comprising a body of semiconductor having a first region of a given conductivity type and a second region of an opposite conductivity type which is formed below a major surface of said semiconductor body, said second region comprising a section of lower impurity concentration and a section of higher impurity concentration in a lateral peripheral area of said second region, an insulative layer formed on a major surface of said semiconductor body, and a common electrode formed on the opposite surface of said semiconductor body.

2. A charge transfer device comprising a body of semiconductor having a first region of a given conductivity type and a second region of an opposite conductivity type which is formed below a major surface of said semiconductor body, said second region comprising a section of lower impurity concentration and a section of higher impurity concentration in a lateral peripheral area of said second region, said section of higher concentration provided on laterally displaced opposite sides of said section of lower concentration, an insulative layer formed on a major surface of said semiconductor body, and a common electrode formed on the opposite surface of said semiconductor body.

3. A charge transfer device comprising a body of semiconductor having a first region of a given conductivity type and a second region of an opposite conductivity type which is formed below a major surface of said semiconductor body, said second region comprising a section of lower impurity concentration and a section of higher impurity concentration in a lateral peripheral area of said second region, said section of higher impurity concentration provided both on laterally displaced opposite sides of and below said section of lower concentration, an insulative layer formed on a major surface of said semiconductor body, and a common electrode formed on the opposite surface of said semiconductor body.

4. A charge transfer device as set forth in claim 1, 2 or 3, wherein said given conductivity type region has a p-type conductivity.

5. A charge transfer device as set forth in claim 1, 2 or 3, wherein said section of higher impurity concentration extends in the direction of transfer of electrons.

6. A charge transfer device as set forth in any one of claims 1, 2 or 3, further comprising a plurality of electrodes placed on said insulative layer and wherein said section of higher impurity concentration is provided below said plurality of electrodes.

7. A charge transfer device as set forth in claim 1, 2 or 3, wherein the impurity concentration of said higher impurity concentration section is approximtely 1.5 to 3 times higher than the impurity concentration of said lower impurity concentration section.

8. A semiconductor charge transfer device comprising:
- a main body of a given conductivity type and having a horizontal major surface,
- an insulative layer formed on said horizontal major surface,
- a common electrode formed on an opposite horizontal surface of said main body,
- a portion of a conductivity type opposite to the conductivity of said main body and formed within said main body adjoining said horizontal major surface thereof,
- said portion of opposite conductivity type comprising first and second regions of different impurity concentrations,
- one of said first and second regions being horizontally displaced from and adjoining the other,
- said one of said regions including three segments, a first segment horizontally displaced from and adjoining one surface of said other region, a second segment horizontally displaced from and adjoining an opposing surface of said other region, and
- a third segment, vertically displaced from and adjoining a horizontal surface of said other region within said main body,
- said other region has having a lower impurity concentration than said one region.

9. A semiconductor charge transfer device comprising:
- a main body of a given conductivity type and having a horizontal major surface,
- an insulative layer formed on said horizontal major surface,
- a common electrode formed on an opposite horizontal surface of said main body,
- a buried structure including a portion of a conductivity type opposite to the conductivity of said main body and formed within said main body adjoining said horizontal major surface thereof, said portion of opposite conductivity type comprising a buried channel region formed of a region having a first impurity concentration and an isolating region surrounding said buried channel region and having a different impurity concentration, greater than said first impurity concentration, said isolating region being horizontally displaced from and adjoining the buried channel region.

* * * * *